（12）United States Patent
Choi et al.

(10) Patent No.: US 7,988,941 B2
(45) Date of Patent: Aug. 2, 2011

(54) GRAPHENE SHEET AND METHOD OF PREPARING THE SAME

(75) Inventors: Jae-young Choi, Yongin-si (KR);
Hyeon-Jin Shin, Yongin-si (KR);
Seon-mi Yoon, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 12/169,114

(22) Filed: Jul. 8, 2008

(65) Prior Publication Data
US 2009/0110627 A1     Apr. 30, 2009

(30) Foreign Application Priority Data

Oct. 29, 2007 (KR) ................ 10-2007-0108860
Mar. 13, 2008 (KR) ................ 10-2008-0023457

(51) Int. Cl.
*C01B 31/04* (2006.01)
(52) U.S. Cl. ............ 423/448; 423/445 R; 423/447.1; 423/447.3
(58) Field of Classification Search .......... 423/445 R, 423/447.1, 447.3, 448
See application file for complete search history.

(56) References Cited

U.S. PATENT DOCUMENTS 5,698,341 A * 12/1997 Tamaki et al. ............ 429/231.8
6,800,584 B2 * 10/2004 Baker et al. ................ 502/184
2004/0099208 A1   5/2004 Kang et al.
2005/0164211 A1 * 7/2005 Hannah .......................... 435/6
2005/0271574 A1  12/2005 Jang et al.

FOREIGN PATENT DOCUMENTS

JP     2003-081699 A    3/2003
WO     2006093989 A2    9/2006

OTHER PUBLICATIONS

European Search Report for EP application No. EP0816766 dated Apr. 2, 2009.
Obraztsov, et al., Chemical vapor deposition of thin graphite films of nanometer thickness, ScienceDirect Carbon 45 (2007) 2017-2021.
Wang, et al., Free-standing subnanometer graphite sheets, American Institute of Physics Aug. 16, 2004, vol. 85, No. 7, pp. 1265-1267.
Obraztsov, et al., Chemical vapor deposition of carbon films: in-situ plasma diagnostics, Letters to the Editor I Carbon 41 Jun. 24, 2007 COI-839, pp. 836-839.
Obraztsov, et al., Correlation of field emission properties with morphology and surface composition of CVD nanocarbon films, ScienceDirect, Diamond and Related Materials 15 (2006) 838-841.
Examination report of Application No. 0816766.8-1218 dated Dec. 15, 2010.

* cited by examiner

*Primary Examiner* — Jerry Lorengo
*Assistant Examiner* — Pritesh Darji
(74) *Attorney, Agent, or Firm* — Cantor Colburn LLP (57) ABSTRACT

An economical method of preparing a large-sized graphene sheet having a desired thickness includes forming a film, the film comprising a graphitizing catalyst; heat-treating a gaseous carbon source in the presence of the graphitizing catalyst to form graphene; and cooling the graphene to form a graphene sheet. A graphene sheet prepared according to the disclosed method is also described.

12 Claims, 5 Drawing Sheets

GRAPHENE SHEET AND METHOD OF PREPARING THE SAME

This application claims priority to of Korean Patent Application No. 10-2007-0108860, filed on Oct. 29, 2007 and Korean Patent Application No. 10-2008-0023457, filed on Mar. 13, 2008, and all the benefits accruing therefrom under 35 U.S.C. §119, the contents of which in their entirety are herein incorporated by reference.

BACKGROUND OF THE INVENTION

1. Field of the Invention

This disclosure relates to a graphene sheet and a method of preparing the same.

2. Description of the Related Art

Generally, graphite is a stack of two-dimensional graphene sheets formed from a planar array of carbon atoms bonded into hexagonal structures. Recently, testing of graphene sheets has revealed beneficial properties of single or multiple-layered graphene sheets.

One beneficial property of graphene is that electrons flow in an entirely unhindered fashion in a graphene sheet, which is to say that the electrons flow at the velocity of light in a vacuum. In addition, graphene sheets exhibit an unusual half-integer quantum Hall effect for both electrons and holes. The electron mobility of conventional graphene sheets is about 20,000 to 50,000 $cm^2/Vs$.

In some applications carbon nanotubes can be used as a conductor.

However carbon nanotubes are expensive due to low yields during synthesis and purification processes. Also single wall carbon nanotubes exhibit different metallic and semiconducting characteristics according to their chirality and diameter. Furthermore, single wall carbon nanotubes having identical semiconducting characteristics have different band gap energies depending on their chirality and diameter. Thus, single wall carbon nanotubes are preferably separated from each other in order to obtain the desired semiconducting or metallic properties. However, separating single wall carbon nanotubes is problematic.

On the other hand, it is advantageous to use graphene sheets because, in a device, graphene sheets can be engineered to exhibit the desired electrical characteristics by arranging the graphene sheets so their crystallographic orientation is in a selected direction since the electrical characteristics of a graphene sheet depend upon crystallographic orientation. It is envisaged that the characteristics of graphene sheets can be applied to future carbonaceous electrical devices or carbonaceous electromagnetic devices.

However, although graphene sheets have these advantageous characteristics, a method of economically and reproducibly preparing a large-sized graphene sheet has not yet been developed. Graphene sheets can be prepared using a micromechanical method or by SiC thermal decomposition. According to the micromechanical method, a graphene sheet can be separated from graphite attached to the surface of Scotch™ tape by attaching the tape to a graphite sample and detaching the tape. In this case, the separated graphene sheet does not include a uniform number of layers and the ripped portions do not have a uniform shape. Furthermore, a large-sized graphene sheet cannot be prepared using the micromechanical method. Meanwhile, in SiC thermal decomposition, a SiC single crystal is heated to remove Si by decomposition of the SiC on the surface thereof, the residual carbon C then forming a graphene sheet. However, the SiC single crystal material used as a starting material in SiC thermal decomposition is very expensive, and formation of a large-sized graphene sheet is problematic.

BRIEF SUMMARY OF THE INVENTION

Disclosed is an economical method of preparing a large-sized graphene sheet having a desired thickness.

Also disclosed is a graphene sheet prepared using the disclosed method.

Disclosed is a membrane, a hydrogen storage medium, an optical fiber and an electrical device using the graphene sheet.

Disclosed a graphene substrate including the graphene sheet.

In an embodiment, there is provided a method of preparing a graphene sheet, the method comprising forming a film, the film comprising a graphitizing catalyst; heat-treating a gaseous carbon source in the presence of the graphitizing catalyst to form graphene; and cooling the graphene to form a graphene sheet.

The gaseous carbon source may be any compound containing carbon, specifically a compound containing 6 or fewer carbon atoms, more specifically a compound containing 4 or fewer carbon atoms, and most specifically a compound containing 2 or fewer carbon atoms. Exemplary gaseous carbon sources include at least one selected from the group consisting of carbon monoxide, ethane, ethylene, ethanol, acetylene, propane, propylene, butane, butadiene, pentane, pentene, cyclopentadiene, hexane, cyclohexane, benzene and toluene.

The film may be a thin film or a thick film.

The thickness of the thin film may be between about 1 nm to about 1000 nm.

The thickness of the thick film may be between about 0.01 mm to about 5 mm.

Hydrogen may also be supplied with the gaseous carbon source. Hydrogen can be used to control gaseous reactions by cleaning the surface of a metal catalyst. The amount of hydrogen may be about 5% to about 40% by volume, specifically about 10% to about 30% by volume, and more specifically about 15% about 25% by volume based on the total volume of a container.

The heat-treatment may be performed at a temperature of about 300° C. to about 2000° C.

The thickness of the graphene may be controlled by regulating the heat-treatment time.

The graphitizing catalyst may include at least one element selected from the group consisting of Ni, Co, Fe, Pt Au, Al, Cr, Cu, Mg, Mn, Mo, Rh, Si, Ta, Ti, W, U, V, and Zr.

The cooling may be performed at a rate of about 0.1° C./min to about 10° C./min.

The method may further include separating the formed graphene sheet from the graphitizing catalyst by removing the graphitizing catalyst using an acid treatment after cooling the heat-treated resultant.

Also disclosed is a graphene sheet prepared according to the disclosed method.

A peak ratio of the Raman D band/G band of the graphene sheet can be equal to or less than about 0.2, and preferably about 0 (zero) when a Raman spectrum of the graphene sheet is measured.

Also disclosed is a graphene sheet derived from a polycyclic aromatic molecule, wherein a plurality of carbon atoms are covalently bound to each other, wherein the graphene sheet comprises about 1 graphene unit layer to about 300 graphene unit layers, and wherein each of the width and length of the graphene sheet is about 1 mm or greater.

The graphene sheet may have about 1 graphene unit layer to about 60 graphene unit layers, and specifically about 1 graphene unit layer to about 15 graphene unit layers.

Each of the width and the length of the graphene sheet may be about 1 mm to about 1,000 mm.

In exemplary embodiments, each of the width and length of the graphene sheet may be about 10 mm or greater.

Also disclosed is a graphene substrate; and a graphene sheet formed on the substrate.

The graphene substrate may further include a graphitizing catalyst layer interposed between the substrate and the graphene sheet.

The graphene substrate may further include a blocking layer interposed between the substrate and the graphitizing catalyst.

The blocking layer may be formed of $SiO_x$, TiN, $Al_2O_3$, $TiO_2$ or $Si_3N$.

The substrate may be a silicon substrate.

The graphitizing catalyst may include a metal catalyst in the form of a thin film or a thick film.

BRIEF DESCRIPTION OF THE DRAWINGS

The above and other aspects, features and advantages will become more apparent by describing in further detail exemplary embodiments thereof with reference to the attached drawings in which.

DETAILED DESCRIPTION OF THE INVENTION

Hereinafter, embodiments are described more fully with reference to the accompanying drawings, in which exemplary embodiments are shown.

Disclosed is an economical method of preparing a large-sized graphene sheet having a desired thickness. The graphene sheet prepared using this method can be applied to various fields in various applications without limitation on the shape of a substrate even if the graphene sheet has a complicated or topographically modulated structure.

The term "graphene sheet" as used herein indicates graphene in the form of a film derived from polycyclic aromatic molecules in which a plurality of carbon atoms are covalently bound to each other. While not wanting to be bound by theory, the covalently bound carbon atoms form 6-membered rings as a repeating unit, but can also form 5-membered rings and/or 7-membered rings. Accordingly, in the graphene sheet the covalently bound carbon atoms (usually, $sp^2$ bonded carbon) are thought to form a single layer. The graphene sheet can have various structures and the structure can vary according to the amount of the 5-membered rings and/or the 7-membered rings. The graphene sheet can comprise a single layer of graphene, or the graphene sheet can comprise a plurality of layers of graphene, up to about 300 layers. Generally, the carbon atoms at the edge of the graphene are saturated with hydrogen atoms.

Figure 1:
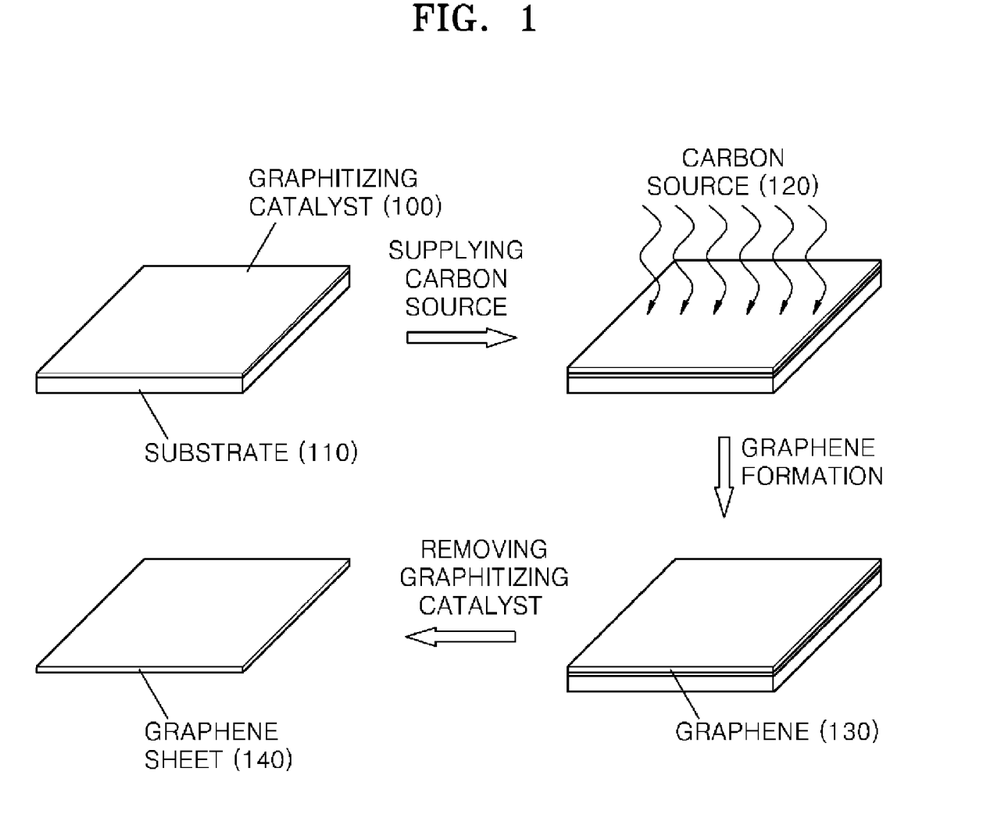
FIG. 1 schematically illustrates a method of preparing a graphene sheet according to an embodiment.

The graphene sheet may be formed according to the method illustrated in FIG. 1. In the disclosed method a graphene sheet 140 can be formed by forming a film, the film comprising a graphitizing catalyst 100, forming graphene 130 by heat-treating a gaseous carbon source 120 in the presence of the graphitizing catalyst 100 while supplying the gaseous carbon source 120 thereto, and cooling the graphene 130 to thereby grow a graphene sheet 140, as is illustrated in FIG. 1. That is, when a gaseous carbon source 120 is heat-treated in the presence of a graphitizing catalyst 100 at a selected temperature for a selected period of time while the gaseous carbon source 120 is supplied to a chamber containing the graphitizing catalyst 100 at a selected pressure, carbon atoms in the gaseous carbon source 120 are bound to each other in a planar hexagonal structure to form graphene. When the graphene 130 is cooled at a selected rate, a graphene sheet 140 having a uniform arrangement can be obtained.

Any substance that comprises carbon and is a gas at about 300° C. or higher can be used as the gaseous carbon source in the formation of the graphene sheet without limitation. The gaseous carbon source can be any compound containing carbon, preferably a compound containing 7 or fewer carbon atoms, more specifically a compound containing 4 or fewer carbon atoms, and most specifically a compound containing 2 or fewer carbon atoms. The gaseous carbon source can comprise a compound having about 1 to about 6 carbon atoms. The gaseous carbon source can comprise a polycyclic aromatic molecule. Exemplary gaseous carbon sources include carbon monoxide, ethane, ethylene, ethanol, acetylene, propane, propylene, butane, butadiene, pentane, pentene, cyclopentadiene, hexane, cyclohexane, benzene, toluene, or the like, or a combination comprising at least one of the foregoing compounds. The gaseous carbon source can thus be one or a combination of the foregoing compounds.

The carbon source can be supplied to a chamber including a graphitizing catalyst at a selected pressure, and the chamber can include only the carbon source, or can further include an inert gas such as helium and argon. The pressure of the carbon source in the chamber can be about $10^{-6}$ to about $10^4$ torr, specifically $10^{-3}$ to about 760 torr.

In addition, hydrogen can be supplied with the gaseous carbon source. Thus the carbon source can also include hydrogen. Hydrogen can be used to control gaseous reactions by cleaning the surface of a metal catalyst. The amount of hydrogen can be about 5% to about 40% by volume, specifically about 10% to about 30% by volume, and more specifically about 15% about 25% by volume, based on the total volume of the chamber.

When the gaseous carbon source is supplied to a chamber, and the chamber and graphitizing catalyst heated to a selected temperature, graphene is formed on the surface of the graphitizing catalyst. The heat-treatment temperature is an important factor in the formation of graphene and can be a temperature between about 300° C. to about 2000° C., specifically about 500° C. to about 1500° C., more specifically about 700° C. to about 1300° C. When the heat-treatment is performed at a temperature lower than about 300° C., graphene is not formed at an acceptable rate. On the other hand, when the heat-treatment is performed at a temperature higher than 2000° C., graphene may not form in the form of a film but in the form of particles or fibers.

The graphitizing catalyst can be in the form of a film. If the film comprising the graphitizing catalyst has a thickness greater than about 0.01 mm, the heat-treatment can be performed at a temperature equal to or greater than 700° C.

The film comprising the graphitizing catalyst disclosed herein can be a thin film or a thick film. If a thin film is used, it can be formed on a substrate. However, the contact strength between the thin film and the substrate can become weak, or a part of the thin film can melt at a temperature higher than about 700° C. Thus, when the heat-treatment is performed at 700° C. or higher, the graphitizing catalyst can be formed as a thick film without a substrate. If a thin film is desired, the thickness of the film can be between about 1 nm to about 5,000 nm, specifically between about 1 nm to about 1,000 nm, more specifically about 10 nm to about 100 nm. If a thick film is desired, the thickness of the film can be about 0.01 mm to about 5 mm, specifically about 0.1 mm to about 1 mm.

The degree of graphene formation can be controlled by regulating the temperature and time of the heat-treatment. That is, other parameters being equal, the longer the heat-treatment time, the greater the amount of graphene formed, and thus the graphene sheet becomes thicker. On the other hand, the shorter the heat-treatment time, the less the thickness of the graphene sheet. Accordingly, the types of the carbon source, the pressure used to supply the carbon source, the types of the graphitizing catalyst, the size of the chamber, and the heat-treatment time are key factors in obtaining a desired thickness of the graphene sheet. The heat-treatment can be performed for about 0.001 hour to about 1000 hours, about 0.01 hour to about 100 hours, or about 0.1 hour to about 10 hours. When the heat-treatment is performed for less than about 0.001 hour, graphene may not be sufficiently obtained. On the other hand, when the heat-treatment is performed for longer than about 1000 hours, too much graphene is formed and graphitization can occur.

The heat-treatment may be performed by induction heating, radiant heating, laser, infrared radiation ("IR"), microwaves, plasma, ultraviolet ("UV") radiation, surface plasmon heating, or the like, or a combination comprising at least one of the foregoing heating methods. The heat source can be disposed on the chamber to increase the temperature in the chamber to a selected level.

After the heat-treatment, the graphene is cooled. The cooling is performed to uniformly grow and arrange the carbon atoms comprising the graphene. Since rapid cooling can cause cracks in the graphene sheet, the heat-treated graphene can be gradually cooled. For example, the heat-treated graphene can be cooled at a rate of about 0.1° C./min to about 10° C./min, about 0.5° C./min to about 5° C./min, or about 1° C./min to about 3° C./min, or naturally cooled by ambient convection. In a natural cooling process, the heat source can be removed so that it is not disposed on the chamber. In this regard, a sufficient cooling rate can be obtained by removing the heat source. The graphene sheet obtained after the cooling may have a thickness of 1 layer, or a thickness of about 1 layer to about 300 layers, specifically about 1 layer to about 60 layers, and more specifically about 1 layer to about 15 layers. A graphene sheet having over 300 layers is regarded as graphite, which is distinct from graphene.

The heat-treatment and cooling method may be performed as a single cycle, but a dense graphene sheet having many layers may be formed by repeating the method several times.

The film comprising the graphitizing catalyst can be disposed on a substrate. In particular, if the film comprising the graphitizing catalyst is a thin film, a substrate can be used for fabrication convenience. Thus if a substrate is used, the graphitizing catalyst layer can be interposed between and in intimate contact with the substrate and the graphene sheet.

The substrate may be an inorganic substrate such as a Si substrate, a glass substrate, a GaN substrate, a silica substrate, or the like, or a combination comprising at least one of the foregoing inorganic substrates; or the substrate can be a metal substrate comprising Ni, Cu, W, or the like, or a combination comprising at least one of the foregoing metals.

In the case of a silica substrate, the surface of the silica substrate can be coated with a blocking layer in order to prevent undesirable reactions between the substrate and the graphitizing catalyst. The blocking layer can be interposed between the substrate and the graphitizing catalyst to inhibit reduction in the efficiency or reduction in the rate of graphene formation that can be caused by reactions between the graphitizing catalyst and the substrate. The blocking layer can comprise a compound such as $SiO_x$, TiN, $Al_2O_3$, $TiO_2$, $Si_3N$, or the like, or a combination comprising at least one of the foregoing compounds, and the blocking layer can be disposed on the substrate by a method comprising sputtering, vapor deposition, or the like. The blocking layer can have a selected thickness between about 0.1 nm to about 1000 μm, about 1 μm to 500 μm, or about 10 μm to about 100 μm. When the thickness of the blocking layer is less than about 0.1 nm, the desired effect of the blocking layer may not be obtained. On the other hand, when the thickness of the blocking layer is greater than about 1000 μm, costs can be increased.

In the disclosed method, the graphitizing catalyst contacts the carbon source and assists carbon elements supplied from the carbon source to be bound to each other to form a planar hexagonal structure. Any catalyst used to synthesize graphite, induce carbonization or prepare carbon nanotubes can be used as the graphitizing catalyst. Exemplary graphitizing catalysts include the metals Ni, Co, Fe, Pt, Au, Al, Cr, Cu, Mg, Mn, Mo, Rh, Si, Ta, Ti, W, U, V, Zr, or the like, or a combination comprising at least one of the foregoing metals. Thus the graphitizing catalyst can comprise a metal selected from the group consisting of Ni, Co, Fe, Pt Au, Al, Cr, Cu, Mg, Mn, Mo, Rh, Si, Ta, Ti, W, U, V, Zr, and the like, and a combination comprising at least one of the foregoing metals. The graphitizing catalyst can be in the form of a plate and can comprise one or a combination of the foregoing metals, or the graphitizing catalyst can be disposed on a substrate by a deposition method such as sputtering, or the like. A thin film or a thick film can comprise the graphitizing catalyst, and the graphitizing catalyst can comprise one or a combination of the foregoing metals.

Since the graphene sheet can be prepared by contacting a graphitizing catalyst with a carbon source, heat-treating, and cooling the graphene to form a graphene sheet, the process is simple and economical. In particular, a large-sized graphene sheet with each of the width and the length thereof being about 1 mm or greater, specifically about 10 mm or more, and more specifically about 10 mm to about 1,000 m, can be prepared. For example, a large-sized graphene sheet can be prepared by controlling the size of the substrate on which the graphitizing catalyst is formed. In addition, since the carbon source is supplied as a gas, the shape or configuration of the substrate and the graphitizing catalyst are not limited. Accordingly, a three-dimensional, contoured, or topographically modulated substrate can be used, and the film comprising the graphitizing catalyst can have various structures accordingly.

The graphene sheet can be identified using a Raman spectrum. That is, since pure graphene has a G' peak in the vicinity of about 1594 $cm^{-1}$, the formation of graphene can be identified by the presence of an absorption at this wavenumber.

Surprisingly, it has been observed the disclosed graphene sheet has a uniform structure without defects. While not wanting to be bound by theory, the uniformity is thought to be because the graphene sheet is prepared by a method comprising high-temperature heat-treatment using a pure gaseous carbon source. A D band intensity of a Raman spectrum of the graphene sheet can indicate the presence of defects formed in the graphene. A strong D band peak can indicate a plurality of defects in the graphene, and a weak D band peak or no D band peak can indicate few defects.

A peak ratio can be defined as a ratio of the peak D band intensity to the peak G band intensity. A peak ratio of a graphene sheet prepared by a stack formation method using a graphitizing catalyst comprised of a metal can be equal to or less than about 0.2, specifically equal to or less than about 0.01, more specifically equal to or less than about 0.001, and can be "0" (zero). The peak ratio "0" indicates that there are few if any defects in the graphene.

The graphene sheet can thus be formed on a substrate and/or on a film comprising the graphitizing catalyst. The graphene sheet can be used with the graphitizing catalyst, or the graphene sheet can be separated from the graphitizing catalyst by treating the graphene sheet with an acid. The acid treatment can be performed after cooling the graphene sheet.

If desired, the graphene sheet can be separated from the substrate.

The separated graphene sheet can be processed in a variety of ways according to its desired use. That is, the graphene sheet can be cut into a selected shape, or the graphene sheet can be wound to form a tube. The processed graphene sheet can also be combined with a various articles to be applied in various ways.

The graphene sheet can be applied in various fields and applications. The graphene sheet can be efficiently used as a transparent electrode since it has excellent conductivity and high uniformity. An electrode that is used on a solar cell substrate, or the like, is desirably transparent to allow light to penetrate therethrough. A transparent electrode formed of the graphene sheet has excellent conductivity and flexibility due to the flexibility of the graphene sheet. A flexible solar cell can be prepared by using a flexible plastic as a substrate and the graphene sheet as a transparent electrode. In addition, where the graphene sheet is used in the form of a conductive thin film in a display device, desired conductivity can be obtained using only a small amount of the graphene sheet and light penetration can thus be improved.

In addition, the graphene sheet formed in the form of a tube can be used as an optical fiber, a hydrogen storage medium or a membrane that selectively allows hydrogen to penetrate.

The disclosure will now be described in greater detail with reference to the following examples. The following examples are for illustrative purposes only and are not intended to limit the scope of the claims.

EXAMPLE 1

A graphitizing catalyst film was formed by depositing Ni on a 1.2 cm×1.5 cm silicon substrate on which 100 nm of $SiO_2$ was coated by sputtering to form a Ni thin film with a thickness of 100 nm. The silicon substrate on which the $SiO_2$ and Ni thin film were formed was disposed in a chamber, and the substrate heat-treated at 400° C. for 20 minutes using a halogen lamp as a heat source while acetylene gas was added to the chamber at a constant rate of 200 sccm to form graphene on the graphitizing catalyst.

Then, a 7 layered graphene sheet having a size of 1.2 cm×1.5 cm was formed by removing the heat source and naturally cooling the interior of the chamber to grow graphene in a uniform arrangement.

Figure 2:
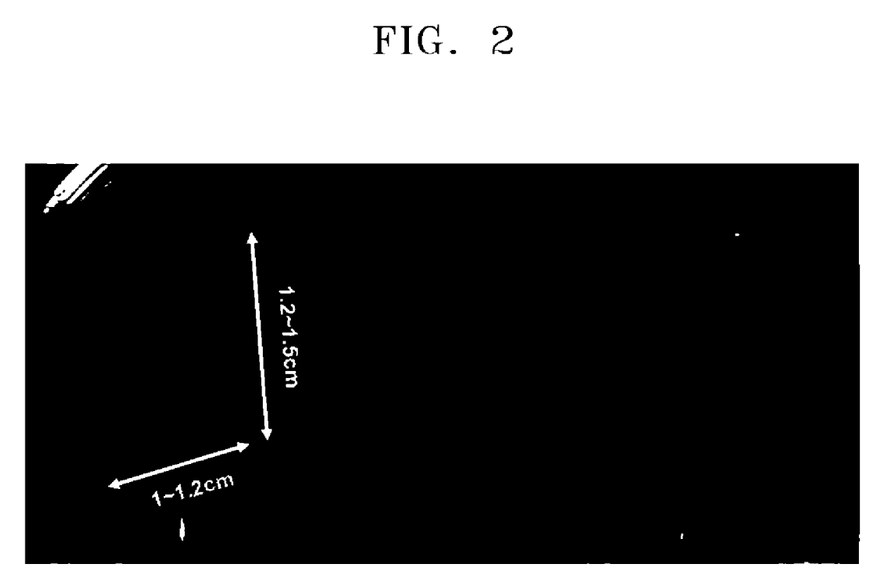
FIG. 2 is a photographic image of a graphene sheet prepared according to Example 1.

Then, the substrate including the graphene sheet was immersed in 0.1 M HCl for 24 hours to remove the Ni thin film. The graphene sheet separated from the substrate during the immersion. FIG. 2 is a photographic image of the graphene sheet prepared according to Example 1.

Figure 3:
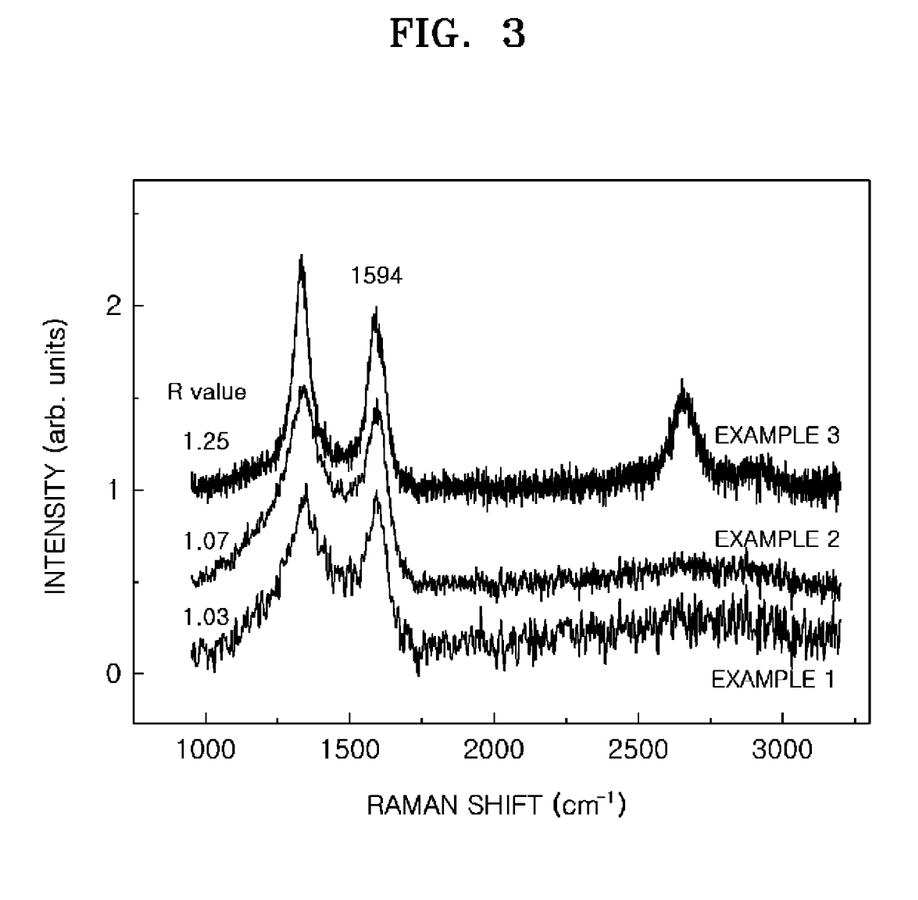
FIG. 3 is a graph illustrating Raman spectra of graphene sheets prepared according to Examples 1 to 3.

FIG. 3 is a graph illustrating a Raman spectrum of the graphene sheet. Referring to FIG. 3, the formation of graphene can be identified by the G' peak shown at 1594 $cm^{-1}$.

Figure 4:
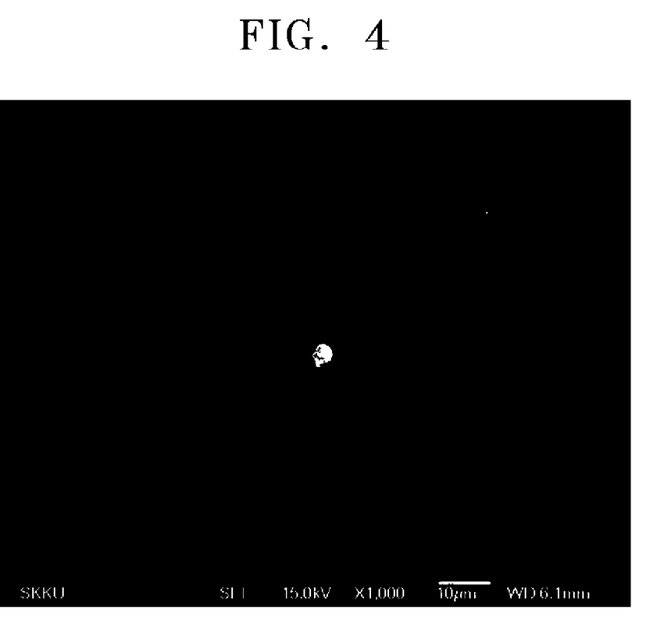
FIG. 4 is a scanning electron microscope ("SEM") image of a graphene sheet prepared according to Example 1.

In addition, FIG. 4 is a scanning electron microscope ("SEM") image of the graphene sheet formed in Example 1. Referring to FIG. 4, it can be seen that a uniform graphene sheet was formed.

EXAMPLE 2

A 16 layered graphene sheet having a size of 1.2 cm×1.5 cm was prepared in the same manner as in Example 1, except that the heat-treatment was performed at 500° C. instead of 400° C.

Then, the substrate including the graphene sheet was immersed in 0.1 M HCl for 24 hours to remove the Ni thin film. The graphene sheet separated from the substrate during the immersion.

FIG. 3 is a graph illustrating a Raman spectrum of the graphene sheet. Referring to FIG. 3, the formation of graphene can be identified by the G' peak shown at 1594 $cm^{-1}$.

Figure 5:
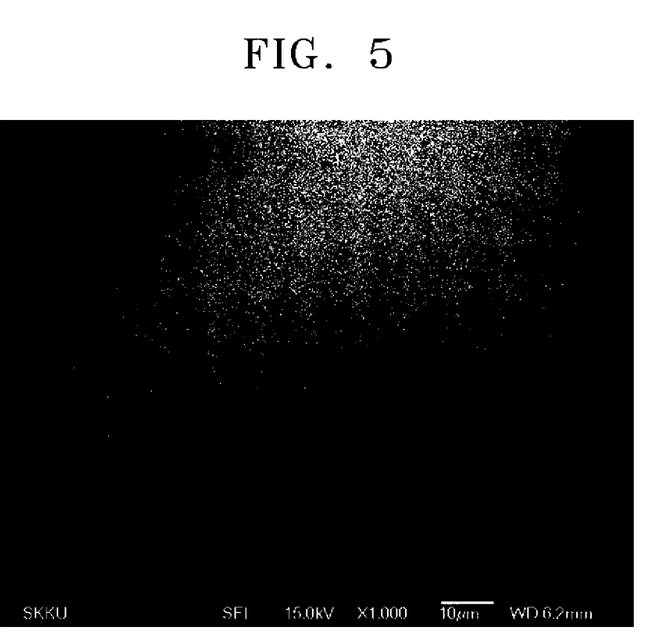
FIG. 5 is a SEM image of a graphene sheet prepared according to Example 2.

FIG. 5 is a SEM image of the graphene sheet formed in Example 2. Referring to FIG. 5, it can be seen that a uniform graphene sheet was formed because features are not observed in the SEM image.

EXAMPLE 3

A 32 layered graphene sheet having a size of 1.2 cm×1.5 cm was prepared in the same manner as in Example 1, except that the heat-treatment was performed at 600° C. instead of 400° C.

Then, the substrate including the graphene sheet was immersed in 0.1 M HCl for 24 hours to remove the Ni thin film. The graphene sheet separated during the immersion.

FIG. 3 is a graph illustrating a Raman spectrum of the graphene sheet. Referring to FIG. 3, the formation of graphene can be identified by the G' peak shown at 1594 $cm^{-1}$.

EXAMPLE 4

A 22 layered graphene sheet having a size of 1.2 cm×1.5 cm was prepared in the same manner as in Example 1, except that the heat-treatment was performed for 1 hour instead of 20 minutes.

Then, the substrate including the graphene sheet was immersed in 0.1 M HCl for 24 hours to remove the Ni thin film. The graphene sheet separated during the immersion.

EXAMPLE 5

An 11 layered graphene sheet having a size of 1.2 cm×1.5 cm was prepared in the same manner as in Example 1, except that methane was used as a carbon source instead of acetylene.

Then, the substrate including the graphene sheet was immersed in 0.1 M HCl for 24 hours to remove the Ni thin film. The graphene sheet separated during the immersion.

EXAMPLE 6

A Ni foil having a size of 1.2 cm×1.5 cm and a thickness of 0.5 mm was prepared. The Ni foil was deposited in a chamber, and heat-treated at 1000° C. for 5 minutes using a halogen lamp as a heat source while acetylene gas was added to the chamber at a constant rate of 200 sccm to form graphene on the graphitizing catalyst.

Then, a 10 layered graphene sheet having a size of 1.2 cm×1.5 cm was formed by removing the heat source and naturally cooling the interior of the chamber to grow graphene in a uniform arrangement.

Figure 6:
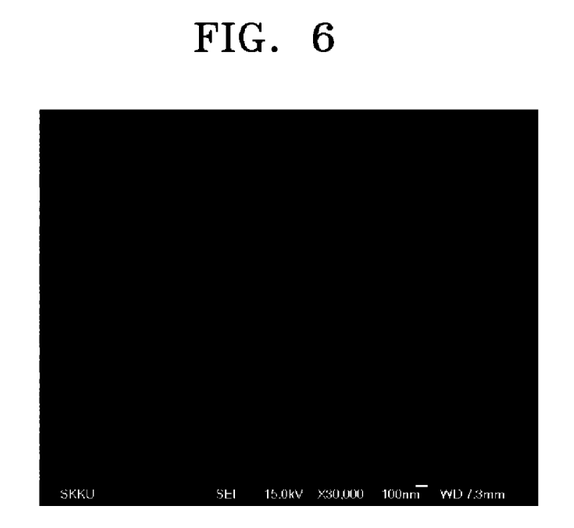
FIG. 6 is a SEM image of a graphene sheet prepared according to Example 6.

Then, the substrate including the graphene sheet was immersed in 0.1 M HCl for 24 hours to remove the Ni foil. The graphene sheet separated during the immersion. FIG. 6 is a SEM image of the separated graphene sheet and a uniform structure was identified by the absence of features.

Figure 7:
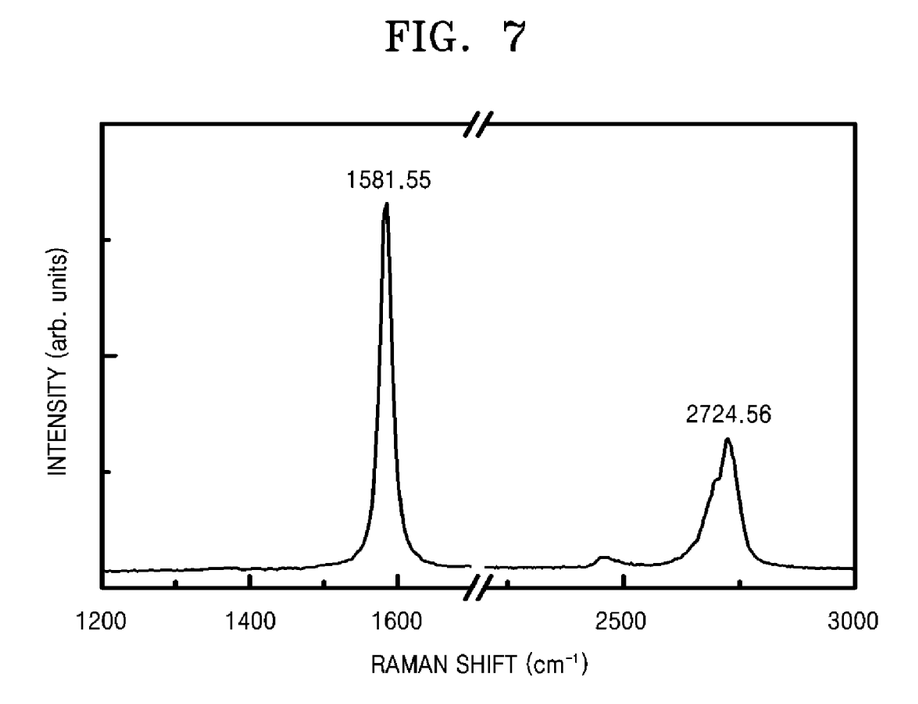
FIG. 7 is a graph illustrating a Raman spectrum of a graphene sheet prepared according to Example 6.

FIG. 7 is a graph illustrating a Raman spectrum of the graphene sheet. Referring to FIG. 7, the formation of graphene can be identified by the G' peak shown at 1594 $cm^{-1}$ and it can also be identified that a uniform graphene without defects was formed a D band was not observed.

Disclosed is an economical method of preparing a large-sized graphene sheet and efficiently controlling the thickness of the graphene sheet. One of ordinary skill in the art will understand that the graphene sheet can be efficiently applied to a transparent electrode, a hydrogen storage medium, an optical fiber, an electrical device, or the like, since a desired thickness of the graphene sheet can be obtained.

The terms "the", "a" and "an" do not denote a limitation of quantity, but rather denote the presence of at least one of the referenced item. The suffix "(s)" as used herein is intended to include both the singular and the plural of the term that it modifies, thereby including at least one of that term (e.g., the colorant(s) includes at least one colorants).

Unless defined otherwise, technical and scientific terms used herein have the same meaning as is commonly understood by one of skill in the art.

As used herein, approximating language can be applied to modify any quantitative representation that can vary without resulting in a change in the basic function to which it is related. Accordingly, a value modified by a term or terms, such as "about" and "substantially," can not to be limited to the precise value specified, in some cases. In at least some instances, the approximating language can correspond to the precision of an instrument for measuring the value. Thus the modifier "about" used in connection with a quantity is inclusive of the stated value and has the meaning dictated by the context (e.g., includes the degree of error associated with measurement of the particular quantity).

All ranges disclosed herein are inclusive of the endpoints and are independently combinable. The endpoints of all ranges directed to the same component or property are inclusive and independently combinable (e.g., ranges of "less than or equal to about 25 wt %, or, more specifically, about 5 wt % to about 20 wt %," is inclusive of the endpoints and all intermediate values of the ranges of "about 5 wt % to about 25 wt %," etc.).

"Optional" or "optionally" means that the subsequently described event or circumstance can or can not occur, and that the description includes instances where the event occurs and instances where it does not. As used herein, "substrate" or "substrates" can be used interchangeably with "surface" or "surfaces."

While the disclosed embodiments have been particularly shown and described with reference to exemplary embodiments thereof, it will be understood by those of ordinary skill in the art that various changes in form and details may be made therein without departing from the spirit and scope of the disclosure as defined by the following claims.

What is claimed is:

1. A method of preparing a graphene sheet, the method comprising:
    depositing a film consisting of a graphitizing catalyst; wherein a width of the film is one millimeter or greater;
    heat-treating a gaseous carbon source in the presence of the graphitizing catalyst to form graphene, while maintaining the shape of the film; and
    cooling the graphene to form a graphene sheet, wherein a width and a length of the graphene sheet are each about 1 millimeter or greater.

2. The method of claim 1, wherein the gaseous carbon source is a compound having about 1 carbon atom to about 7 carbon atoms.

3. The method of claim 1, wherein the gaseous carbon source is a compound selected from the group consisting of carbon monoxide, ethane, ethylene, ethanol, acetylene, propane, propylene, butane, butadiene, pentane, pentene, cyclopentadiene, hexane, cyclohexane, benzene, toluene, methane, and a combination comprising at least one of the foregoing compounds.

4. The method of claim 1, wherein the heat-treating is performed at a temperature of about 300° C. to about 2000° C.

5. The method of claim 1, wherein the film has a thickness of about 1 nm to about 5,000 nm.

6. The method of claim 5, wherein the film has a thickness of about 1 nm to about 1000 nm.

7. The method of claim 5, wherein the film has a thickness of about 0.01 mm to about 5 mm.

8. The method of claim 1, wherein the heat-treating is conducted for about 0.001 hour to about 1000 hours.

9. The method of claim 1, wherein the graphitizing catalyst comprises an element selected from the group consisting of Ni, Co, Fe, Pt Au, Al, Cr, Cu, Mg, Mn, Mo, Rh, Si, Ta, Ti, W, U, V, Zr, and a combination comprising at least one of the foregoing elements.

10. The method of claim 1, further comprising separating the graphene sheet from the graphitizing catalyst by treating the graphene sheet with an acid after cooling the graphene sheet.

11. The method of claim 1, wherein hydrogen is further supplied with the gaseous carbon source.

12. The method of claim 1, wherein the graphene consists of a single layer of graphene.

* * * * *